(12) United States Patent
Zhang

(10) Patent No.: US 11,552,092 B1
(45) Date of Patent: Jan. 10, 2023

(54) SEMICONDUCTOR MEMORY DEVICE AND MANUFACTURING METHOD THEREOF

(71) Applicant: CHANGXIN MEMORY TECHNOLOGIES, INC., Hefei (CN)

(72) Inventor: Kui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/647,743

(22) Filed: Jan. 12, 2022

Related U.S. Application Data

(63) Continuation of application No. PCT/CN2021/117491, filed on Sep. 9, 2021.

(30) Foreign Application Priority Data

Jul. 8, 2021 (CN) .......................... 202110772365.6

(51) Int. Cl.
*H01L 27/1156* (2017.01)
*H01L 27/11556* (2017.01)
(Continued)

(52) U.S. Cl.
CPC .. *H01L 27/11556* (2013.01); *H01L 27/11521* (2013.01); *H01L 27/11568* (2013.01); *H01L 27/11582* (2013.01)

(58) Field of Classification Search
CPC ......... H01L 27/11568; H01L 27/11521; H01L 27/11582; H01L 27/11556
See application file for complete search history.

(56) References Cited

U.S. PATENT DOCUMENTS

| 8,441,053 | B2 | 5/2013 | Chen et al. |
| 10,373,968 | B2 | 8/2019 | Huo |

(Continued)

FOREIGN PATENT DOCUMENTS

| CN | 104241294 A | 12/2014 |
| CN | 104393046 A | 3/2015 |

(Continued)

OTHER PUBLICATIONS

International Search Report and English Translation cited in PCT/CN2021/117491 dated Mar. 17, 2022, 11 pages.

(Continued)

*Primary Examiner* — Sarah K Salerno
(74) *Attorney, Agent, or Firm* — Cooper Legal Group, LLC

(57) ABSTRACT

The present disclosure provides a semiconductor memory device and a manufacturing method thereof, and relates to the technical field of semiconductors. The semiconductor memory device includes a substrate, a source structure, a laminated structure, a floating body, a trench region, a drain structure and a gate structure. The source structure is formed on the substrate. The laminated structure includes a nitride layer and an oxide layer that are alternately laminated on the source structure. The floating body is formed in the oxide layer, and a through hole is formed in the floating body along a lamination direction of the laminated structure. The trench region is formed inside the floating body, a through hole is also formed in the trench region along the lamination direction, and the trench region is in contact with the source structure.

18 Claims, 7 Drawing Sheets

(51) Int. Cl.
    *H01L 27/11521*     (2017.01)
    *H01L 27/11568*     (2017.01)
    *H01L 27/11582*     (2017.01)

(56) References Cited

U.S. PATENT DOCUMENTS

| | | | |
|---|---|---|---|
| 10,468,414 | B2 | 11/2019 | Kim et al. |
| 10,964,718 | B2 | 3/2021 | Xiao |
| 2013/0221423 | A1 | 8/2013 | Kawasaki et al. |
| 2015/0380423 | A1 | 12/2015 | Kanakamedala et al. |
| 2018/0047741 | A1 * | 2/2018 | Kuge ................ H01L 27/11556 |

FOREIGN PATENT DOCUMENTS

| | | | |
|---|---|---|---|
| CN | 109979941 A | 7/2019 | |
| CN | 110047839 A | 7/2019 | |
| CN | 111755453 A | 10/2020 | |
| TW | I517307 B | 1/2016 | |
| WO | WO-2021133427 A1 * | 7/2021 | ........ H01L 27/11556 |

OTHER PUBLICATIONS

Written Opinion and English Translation cited in PCT/CN2021/117491 dated Mar. 17, 2022, 8 pages.

\* cited by examiner

SEMICONDUCTOR MEMORY DEVICE AND MANUFACTURING METHOD THEREOF

CROSS-REFERENCE TO RELATED APPLICATIONS

This is a continuation of International Application No. PCT/CN2021/117491, filed on Sep. 9, 2021, which claims the priority to Chinese Patent Application No. 202110772365.6, titled "SEMICONDUCTOR MEMORY DEVICE AND MANUFACTURING METHOD THEREOF" and filed on Jul. 8, 2021. The entire contents of International Application No. PCT/CN2021/117491 and Chinese Patent Application No. 202110772365.6 are incorporated herein by reference.

TECHNICAL FIELD

The present disclosure relates to the technical field of semiconductors, and in particular to a semiconductor memory device and a manufacturing method thereof.

BACKGROUND

To meet consumer demands for excellent performance and low price, the semiconductor memory devices are required to have high integrity. In general, the integrity is determined by an area occupied by a unit memory cell.

To improve the integrity, a capacitor-free memory cell capable of greatly decreasing the area occupied by the memory cell is provided on the basis of a traditional memory cell with a transistor and a capacitor.

It should be noted that information disclosed in the above background section is used merely for a better understanding of the background of the present disclosure, and therefore may include information that does not constitute the prior art known to those of ordinary skill in the art.

SUMMARY

According to an aspect, the present disclosure provides a semiconductor memory device, including a substrate, a source structure, a laminated structure, a floating body, a trench region, a drain structure and a gate structure. The source structure is formed on the substrate. The laminated structure includes a nitride layer and an oxide layer, the nitride layer and the oxide layer are alternately laminated on the source structure. The floating body is formed in the oxide layer, and a through hole is formed in the floating body along a lamination direction of the laminated structure. The trench region is formed inside the floating body, a through hole is also formed in the trench region along the lamination direction, and the trench region is in contact with the source structure. The drain structure is formed on a top of the laminated structure in the lamination direction and in contact with the trench region. The gate structure is formed inside the trench region.

According to an aspect, the present disclosure provides a method of manufacturing a semiconductor memory device, including: providing a substrate; forming a source structure on the substrate through deposition; alternately depositing a nitride layer and an oxide layer on the source structure in sequence, and forming a laminated structure; performing etching to form a first through hole, the first through hole running through the laminated structure, and exposing the source structure; partially etching the oxide layer through the first through hole, and forming an oxide layer groove; depositing a floating body in the oxide layer groove; depositing a trench region material layer in the first through hole, wherein the trench region material layer is in contact with the floating body; depositing a drain structure on the laminated structure, wherein the drain structure is in contact with the trench region material layer; performing etching to form a second through hole, the second through hole running through the drain structure and the trench region material layer, and exposing the source structure, wherein a remaining trench region material layer forms a trench region; and depositing a gate structure in the second through hole.

It should be understood that the above general description and the following detailed description are only exemplary and explanatory, and should not be construed as a limitation to the present disclosure.

BRIEF DESCRIPTION OF THE DRAWINGS

The accompanying drawings, which are incorporated into and constitute a part of the description, illustrate the embodiments of the present disclosure and together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
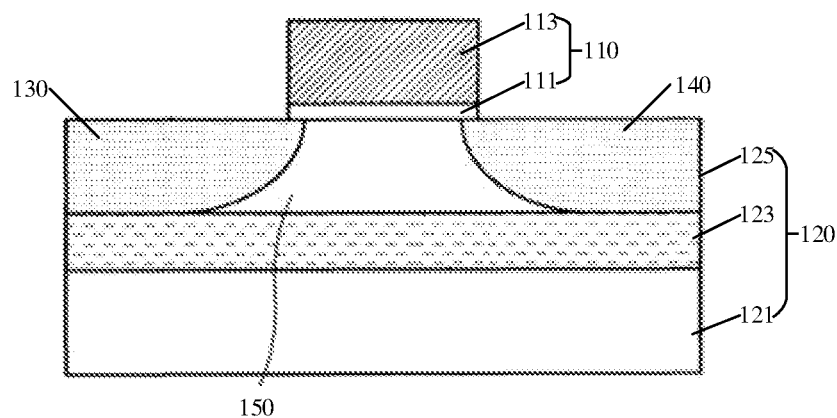
FIG. 1 shows a cross-sectional view of a capacitor-free dynamic random access memory.

Exemplary implementations are described below more comprehensively with reference to the accompanying drawings. The exemplary implementations may be implemented in various forms, and may not be construed as being limited to those described herein. On the contrary, these exemplary implementations are provided to make the present disclosure comprehensive and complete and to fully convey the concept manifested therein to those skilled in the art. The same reference numerals in the figures indicate the same or similar structures, and thus their detailed descriptions will be omitted.

The foregoing described features, structures, or characteristics may be incorporated into one or more implementations in any suitable manner. If possible, the features discussed in the various embodiments are interchangeable. In the foregoing description, many specific details are provided to give a full understanding of the implementations of the present disclosure. However, those skilled in the art will be aware that the technical solutions of the present disclosure may be practiced without one or more of the specific details, or other methods, materials, and the like may be used. In other cases, well-known structures, materials, or operations are not shown or described in detail to avoid obscuring aspects of the present disclosure.

Although relative terms such as "upper" and "lower" are used in this specification to describe the relative relationship of one component of an icon to another, these terms are used in this specification only for convenience, for example, according to the orientation of the examples described in the accompanying drawings. It can be understood that if the device of the icon is turned upside down, the components described as "upper" will become the "lower" components. When a structure is "on" other structures, it may mean that the structure is integrally formed on other structures, or that the structure is "directly" disposed on other structures, or that the structure is "indirectly" disposed on other structures through another structure.

The terms "one", "a", "the", "said", and "at least one" are used to indicate the presence of one or more elements/components/and the like; the terms "includes" and "has" are used to indicate an open-ended inclusion and to mean that additional elements/components/and the like may exist in addition to the listed elements/components/and the like. The terms "first" and "second" are used only as markers, not as a restriction on the number of objects.

FIG. 1 shows a cross-sectional view of a capacitor-free dynamic random access memory (DRAM).

As shown in FIG. 1, a gate 110 may be formed on a silicon base 120. The silicon base 120 is formed by laminating a first silicon layer 121, an oxide layer 123 and a second silicon layer 125 in sequence. The gate 110 is formed by laminating a gate insulating layer 111 and a gate conductive layer 113 in sequence. A source 130 and a drain 140 are formed in the second silicon layer 125 on two sides of the gate 110. A floating trench body 150 electrically isolated from the first silicon layer 121 is formed in the second silicon layer 125 between the source 130 and the drain 140. The capacitor-free DRAM stores a data value "1" or "0" by accumulating holes or electrons in the floating trench body 150.

In further research, the applicant finds that an area occupied by a memory cell in the capacitor-free DRAM may still be decreased.

Figure 2A:
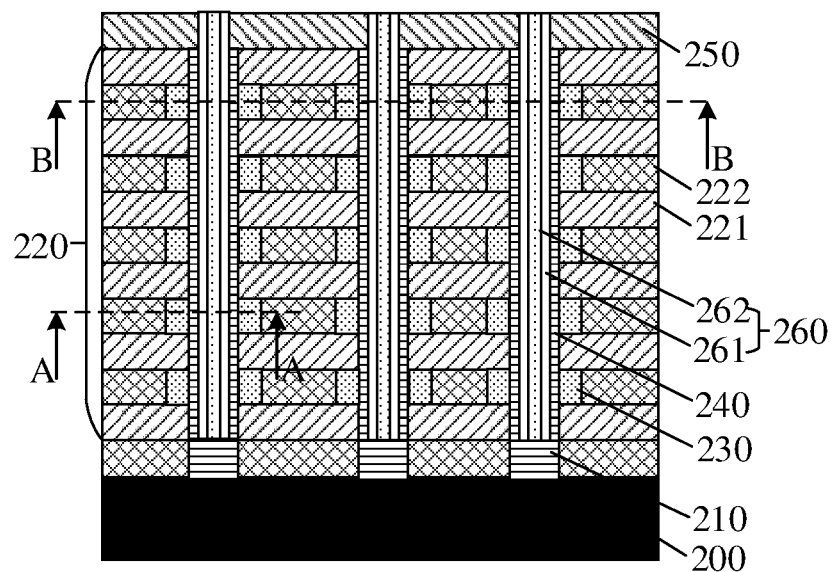
FIG. 2A is a schematic structural diagram of a semiconductor memory device according to an exemplary implementation of the present disclosure.
Figure 2B:
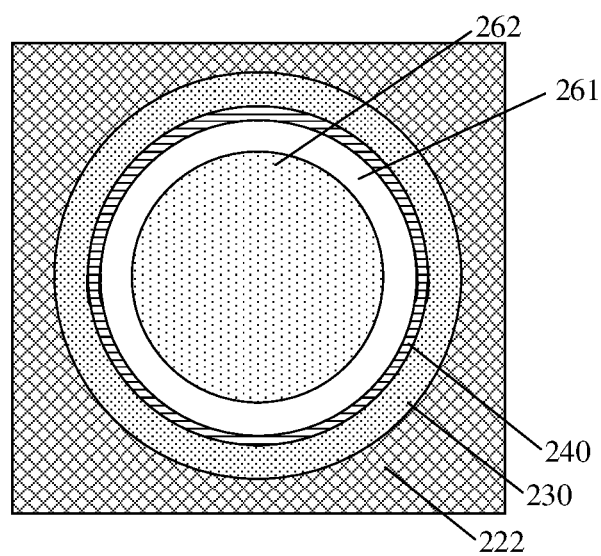
FIG. 2B shows a schematic cross-sectional view of the semiconductor memory device provided in FIG. 2A in an A-A direction.
Figure 3:
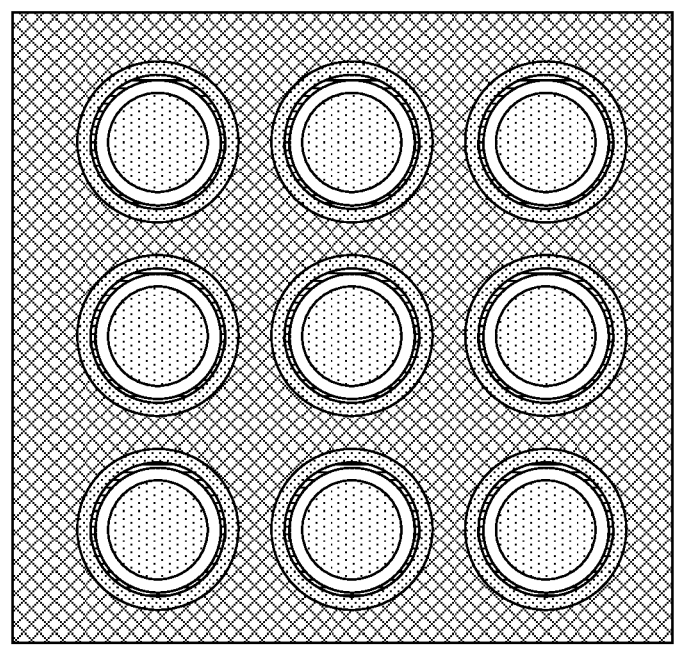
FIG. 3 shows a schematic cross-sectional view of the semiconductor memory device provided in FIG. 2A in a B-B direction.

Based on this, an exemplary implementation of the present disclosure provides a semiconductor memory device to further decrease the area occupied by the memory cell in the capacitor-free DRAM. In this way, the integrity of the semiconductor memory device is improved. With reference to FIGS. 2(a), 2(b) and 3, the semiconductor memory device may include a substrate 200, a source structure 210, a laminated structure 220, a floating body 230, a trench region 240, a drain structure 250 and a gate structure 260.

The substrate 200 is mainly a silicon substrate used to ensure the mechanical strength of the semiconductor memory device. The substrate may have a rectangular or circular cross section, and may have a thickness set according to actual conditions, for example, several micrometers. This is not specially limited in the exemplary implementation.

In the exemplary implementation of the present disclosure, the source structure 210 are formed or may be deposited on the substrate 200. As required, the source structure 210 may be deposited as a whole structure, or a whole source structure 210 may be etched into a plurality of strip-shaped structures. FIG. 2A shows three strip-shaped source structures 210. In an actual application, the quantity of the source structures 210 is set according to an integrity requirement of the semiconductor memory device.

It should be noted that when there are a plurality of source structures 210, the plurality of source structures 210 are spaced apart from each other, and an insulating material need to be filled between the plurality of source structures to form an isolation structure. A structure formed by the isolation structure and the source structures 210 is beneficial for the formation of the laminated structure 220.

In the exemplary implementation of the present disclosure, the laminated structure 220 includes a nitride layer 221 and an oxide layer 222 that are alternately laminated and deposited on the source structure 210. The nitride layer 221 may be made of a silicon nitride material through deposition, and the oxide layer 222 may be made of a silicon oxide material through deposition.

In an actual application, the quantity of the nitride layers 221 and the quantity of the oxide layers 222 may be determined according to an actual requirement. When there is only one oxide layer 222, there may be two nitride layers 221. When there are a plurality of oxide layers 222, there may be a plurality of nitride layers 221 one more than the oxide layers 222. The specific quantity of the nitride layers 221 and the specific quantity of the oxide layers 222 are not specially limited in the exemplary implementation of the present disclosure.

In the exemplary implementation of the present disclosure, the floating body 230 is formed in the oxide layer 222, and a specific forming manner is described later. A through hole is formed in the formed floating body 230 along a lamination direction of the laminated structure 220. A trench region 240 may be formed in the through hole, such that the trench region 240 is formed inside the floating body 230.

In an actual application, if there are a plurality of oxide layers 222, the through hole of the floating body 230 formed in different oxide layers 222 may be communicated, and run through all the nitride layers 221 to form a communication hole that exposes the source structure 210.

In this way, the trench region 240 may be directly formed in the communication hole, such that the trench region 240 forms an integral structure in the communication hole. Meanwhile, the trench region 240 is in contact with a plurality of layers of the floating body 230. A through hole is also formed in the trench region 240 along the lamination direction to deposit the gate structure 260.

In the exemplary implementation of the present disclosure, the drain structure 250 is formed on the top of the laminated structure 220 in the lamination direction, and in contact with the trench region 240. The trench region 240 is arranged in the communication hole. In addition, one end of the trench region 240 is in contact with the source structure 210 and the other end thereof is in contact with the drain structure 250.

In the exemplary implementation of the present disclosure, the gate structure 260 includes a gate oxide layer 261 and a gate layer 262. The gate oxide layer 261 is formed inside the trench region 240, and a through hole is formed in the gate oxide layer 261 along the lamination direction. The through hole in the gate oxide layer 261 is filled with the gate layer 262.

In an actual application, the formed gate structure 260 may run through the drain structure 250, such that the gate layer 262 is externally connected to conductive structure.

The semiconductor memory device according to the exemplary implementation of the present disclosure may further include a plurality of conductive through holes configured to expose the source structure 210, the drain structure 250 or the gate layer 262. The conductive through holes also need to be filled with a conductive material, so as to implement electrical connection of the source structure 210, the drain structure 250 or the gate layer 262.

In the exemplary implementation of the present disclosure, one source structure 210 may also correspond to a plurality of pairs of trench regions 240 and gate structures 260, and each of the trench regions 240 corresponds to a plurality of layers of the floating body 230. In this way, a plurality of memory cells may be formed, thereby improving the integrity of the semiconductor memory device. As shown in FIG. 2B, there are three source structures 210, and each of the source structures 210 corresponds to three pairs of trench regions 240 and gate structures 260. In this way, nine memory cells are formed in a direction perpendicular to the lamination direction. Moreover, in the lamination direction, each of the trench regions 240 also corresponds to a plurality of layers of the floating body 230, so as to exponentially increase the quantity of the memory cells in a three-dimensional space. The memory cells may share a same source structure 210 and a same drain structure 250, so as to decrease areas occupied by the memory cells and greatly improve the integrity of the semiconductor memory device.

From the perspective of data storage, the floating body 230 is equivalent to hole memory cells. The floating body 230 is a heavily-doped semiconductor structure, for example, more ions such as chromium, antimony, aluminum, gallium and the like are doped in semiconductor silicon to improve the conductivity of the floating body 230. A doping concentration of the floating body 230 is higher than a doping concentration of the trench region 240, such that a valence band of the floating body 230 is higher than a valence band of the trench region 240. That is, there are more electrons in the floating body 230.

In the exemplary implementation of the present disclosure, to further increase the quantity of the electrons stored in the floating body 230, quantum dots may also be doped in the floating body 230. The quantum dots are semiconductor nano-structures that bound excitons in three spatial directions. Each of the quantum dots has a small quantity of (1 to 100) electrons, holes or electron-hole pairs, that is, an electrical quantity of the quantum dot is integer multiple of an elementary charge. Therefore, the quantity of the electrons in the floating body 230 may be increased by doping the quantum dots in the floating body 230.

According to the semiconductor memory device according to an exemplary implementation of the present disclosure, a plurality of layers of the floating body and the trench region in contact with the floating body are arranged in the laminated structure. In addition, the drain structure and the source structure that are in contact with the trench region are arranged, respectively, above and below the laminated structure along the lamination direction, and the gate structure is arranged inside the trench region. In one aspect, memory cells formed by the plurality of layers of the floating body may share a pair of source structure and drain structure, to decrease areas occupied by the memory cells. In another aspect, a plurality of pairs of trench regions and floating body may be arranged in a direction perpendicular to the lamination direction, to exponentially increase the quantity of the memory cells in a three-dimensional space. Moreover, the memory cells may share a same source structure and a same drain structure, to decrease the areas occupied by the memory cells, which greatly improves the integrity of the semiconductor memory device. In yet another aspect, the floating body is arranged outside the trench region, and not in direct contact with the source structure and the drain structure, such that there is no electrical charge leakage. Therefore, a data retention time of the floating body is prolonged.

A method of manufacturing a semiconductor memory device according to an exemplary implementation of the present disclosure is described in detail below with reference to the accompanying drawings.

It should be understood that, to illustrate the process effect, the accompanying drawings are not drawn to scales of actual device structures.

In the exemplary implementation of the present disclosure, main manufacturing steps of the semiconductor memory device are as follows.

Step 10: Provide a substrate.

Step 20: Form a source structure on the substrate through deposition.

Step 30: Alternately deposit a nitride layer and an oxide layer on the source structure in sequence, and form a laminated structure.

Step 40: Perform etching to form a first through hole that runs through the laminated structure, and expose the source structure.

Step 50: Partially etch the oxide layer through the first through hole, and form an oxide layer groove.

Step 60: Deposit a floating body in the oxide layer groove.

Step 70: Deposit a trench region material layer in the first through hole. The trench region material layer is in contact with the floating body.

Step 80: Deposit a drain structure on the laminated structure. The drain structure is in contact with the trench region material layer.

Step 90: Perform etching to form a second through hole that runs through the drain structure and the trench region material layer, and expose the source structure. The remaining trench region material layer forms a trench region.

Step 91: Deposit a gate structure in the second through hole.

A manufacturing process of the semiconductor memory device is described below through a specific implementation method.

Specifically, the manufacturing steps of the semiconductor memory device are as follows.

Figure 4A:
FIGS. 4A to 4K are illustration diagrams of a semiconductor memory device according to an exemplary implementation of the present disclosure.
Figure 4B:
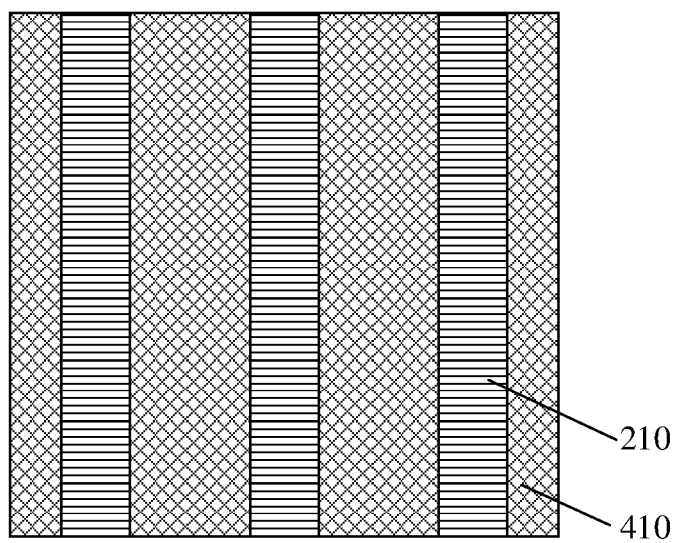

As shown in FIG. 4A, the substrate 200 is provided, and a first conductive structure is deposited on the substrate 200. In addition, the first conductive structure is etched, and ions are doped in the etched first conductive structure, for example, n-type ions or p-type ions, to form a plurality of source structures 210 spaced apart from each other.

In an actual application, the substrate 200 may be a silicon substrate, germanium-silicon, a doped silicon substrate and the like. The substrate 200 may have a circular, rectangular or square cross section. This is not specially limited in the exemplary implementation of the present disclosure.

In an actual application, the plurality of source structures 210 formed through etching may be as shown in a top view 4(b) of FIG. 4A. Trenches between the plurality of source structures 210 may be filled with an insulating material to form an isolation structure 410.

Figure 4C:
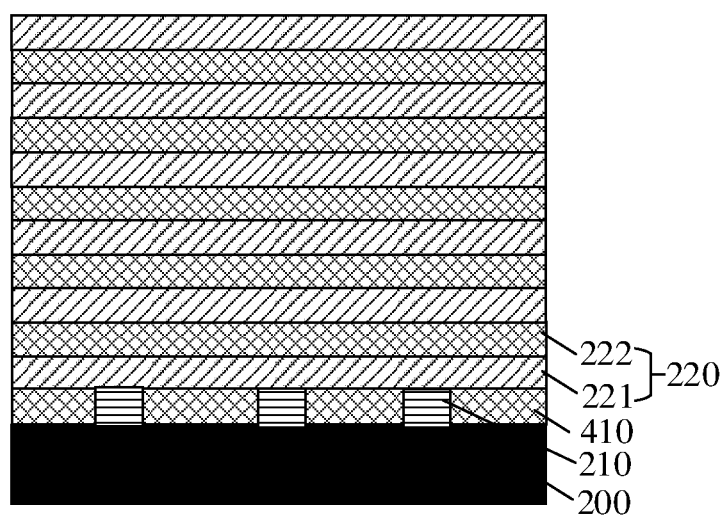

As shown in FIG. 4C, the nitride layers 221 and the oxide layers 222 are alternately deposited on the source structures 210 in sequence to form the laminated structure 220. The nitride layer 221 may be made of silicon nitride through deposition, and the oxide layer 222 may be made of silicon oxide through deposition.

Figure 4D:
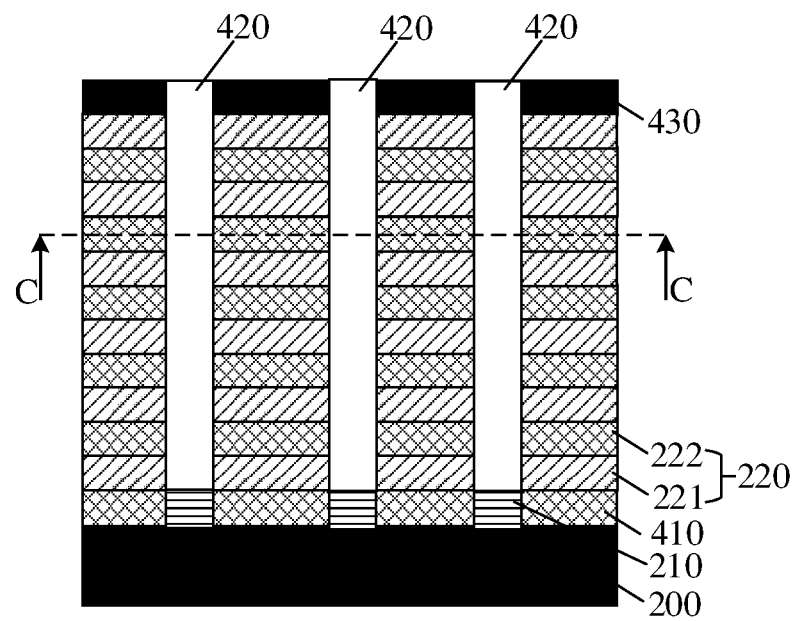

As shown in FIG. 4D, the first through hole 420 that runs through the laminated structure 220 is formed through etching, for example, the laminated structure 220 is etched through pattern etching. The first through hole 420 needs to run through the whole laminated structure 220 to expose the source structure 210. In addition, to protect the laminated structure 220 in the etching process, a grinding layer 430 may also be arranged on the top of the laminated structure 220. A shape of the first through hole 420 is decided by a shape of a patterned mask layer, and the specific shape of the patterned mask layer may be determined according to actual conditions, and details are not described herein again.

Figure 4E:
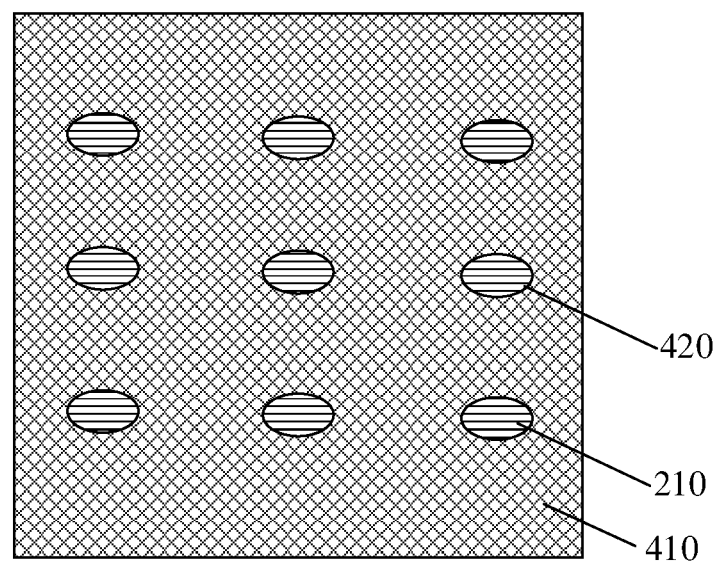

FIG. 4E shows a top view of a structure as shown in FIG. 4D on a C-C cross section. As shown in FIG. 4E, when there are a plurality of source structures 210, each of the source structures 210 needs to correspond one first through hole 420 obtained through etching, to expose the source structure 210.

Figure 4F:
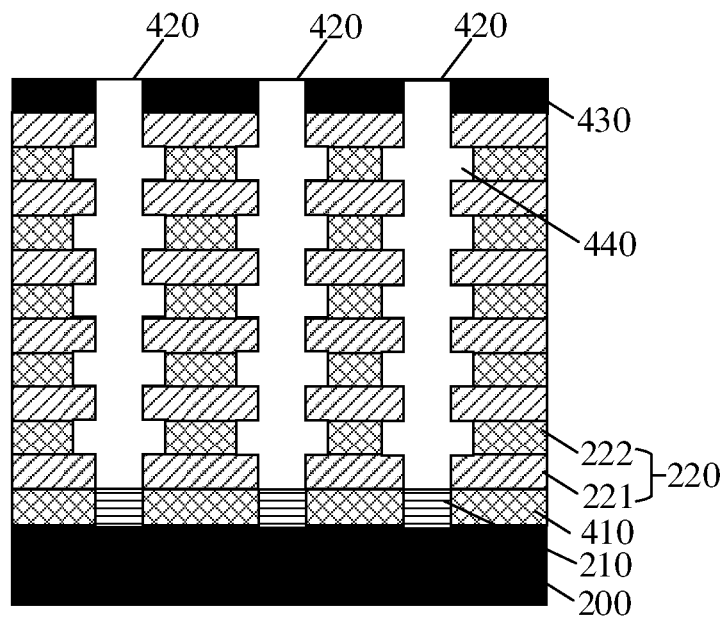

As shown in FIG. 4F, an etching material is determined according to an etching selectivity of the nitride layer 221 to the oxide layer 222. The etching material is imported into the first through hole 420, such that the oxide layer 222 is partially etched through the first through hole 420 to form the oxide layer groove 440.

Figure 4G:
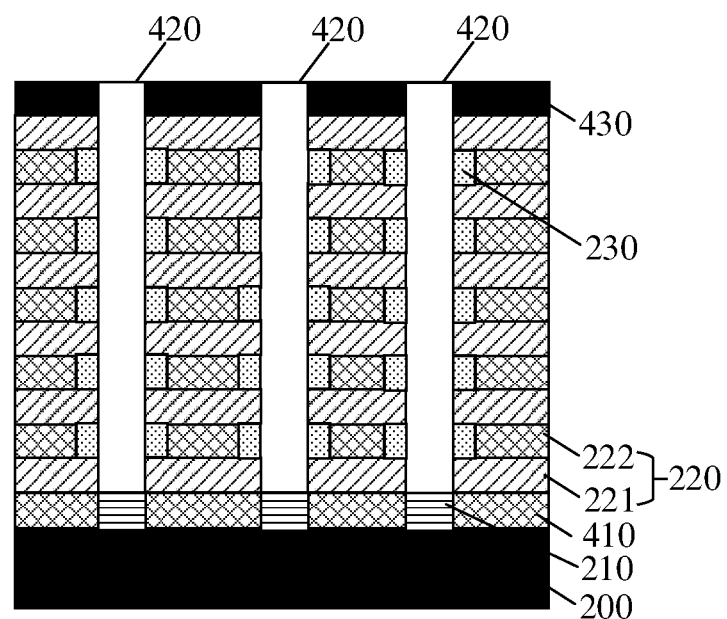

As shown in FIG. 4G, the floating body material layer is deposited in the first through hole 420 and the oxide layer groove 440 to fill the first through hole 420 and the oxide layer groove 440. The floating body material layer in the first through hole 420 is etched, and the floating body material layer in the oxide layer groove 440 is retained to form the floating body 230.

In an actual application, there may be a plurality of deposition manners of the floating body material layer. In the exemplary implementation of the present disclosure, the first through hole 420 and the oxide layer groove 440 may be filled through epitaxial growth of monocrystalline silicon, and chromium ions are heavily doped in the monocrystalline silicon on situ to form the floating body material layer. Or, a semiconductor material or a metal material with a valence band higher than a valence band of silicon may also be deposited, for example, any one from the group consisting of chromium, silicon-germanium, aluminum antimonide and gallium antimonide. In addition, quantum dots may also be added in the material of the floating body material layer to store more electrons.

In a process of etching the floating body material layer in the first through hole 420, a self-aligned anisotropic etching manner or other manners may be used. This is not specially limited in the exemplary implementation of the present disclosure.

Figure 4H:
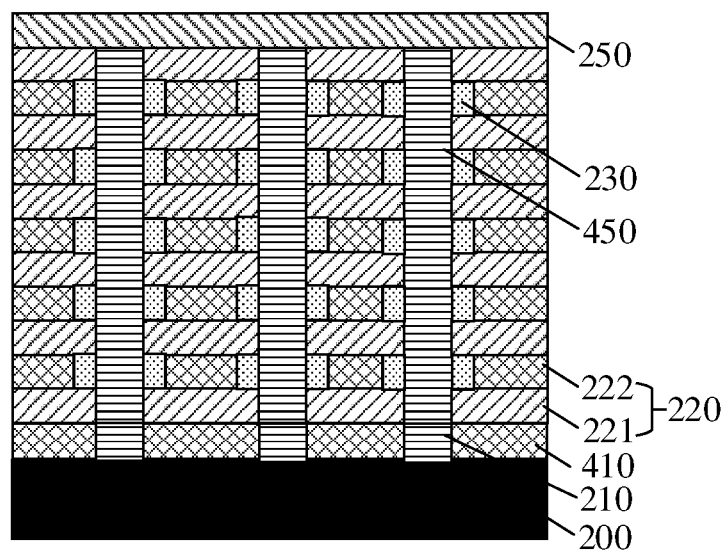

As shown in FIG. 4H, the trench region material layer is deposited in the first through hole 420. Specifically, the trench region material layer 450 may be deposited through epitaxial growth. The trench region material layer 450 fills the first through hole 420, such that the trench region material layer 450 is in contact with the floating body 230. The trench region material layer 450 may be made of a semiconductor material. In addition, when the semiconductor material is deposited, n-type or p-type ions may be added on situ to form a semiconductor conductive channel.

Figure 4I:
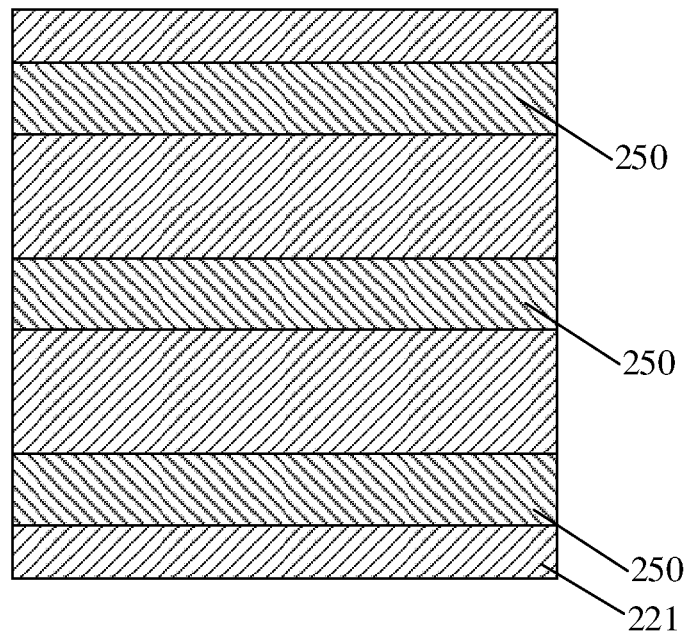

Subsequently, the drain structure 250 is deposited on the laminated structure 220. In a specific process of depositing the drain structure 250, a second conductive structure may be deposited on the laminated structure 220, and ions are doped in the second conductive structure, for example, n-type or p-type ions, to form a whole drain structure 250. Or, the second conductive structure is etched, and ions are doped in the etched second conductive structure to form a plurality of drain structures 250 spaced apart from each other. Each of the drain structures 250 corresponds to at least one first through hole 420. The drain structures 250 need to be in contact with the trench region material layer. FIG. 4I shows a top view of a structure as shown in FIG. 4H.

Figure 4J:
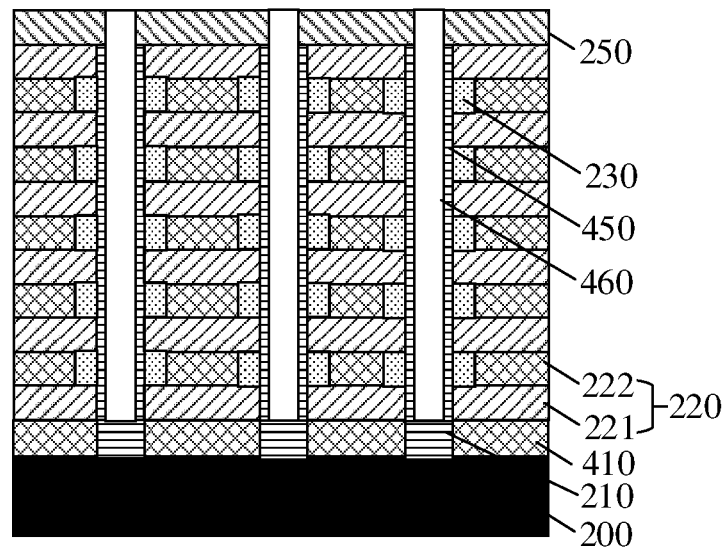
Figure 4K:
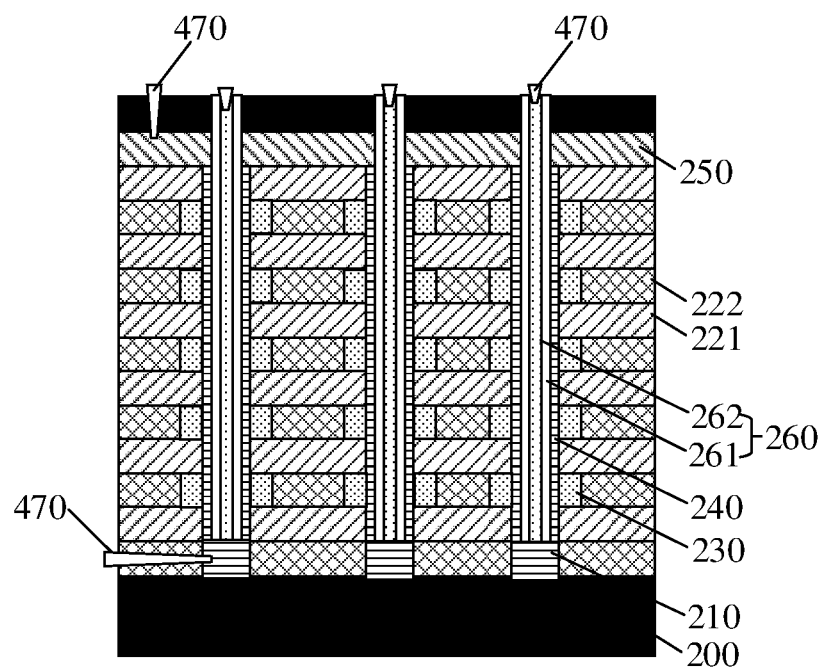

As shown in FIG. 4J, a second through hole 460 that runs through the drain structure 250 and the trench region material layer 450 is formed through etching, to expose the source structure 210. Specifically, the second through hole 460 may be located in the first through hole 420, and the trench region material layer 450, retained after the second through hole 460 is formed through etching, forms the trench region 240. The quantity of the second through holes 460 is determined by the first through holes 420.

After the semiconductor memory device as shown in FIG. 4J is obtained, a gate oxide layer 261 may be deposited inside the trench region 240 through the second through hole 460. One or more gate oxide layers 261 that are internally hollow may be deposited inside the trench region. The hollow gate oxide layer 261 is filled with gate layer 262 to obtain the semiconductor memory device as shown in FIG. 2A. The gate layer 262 may be made of metal or polycrystalline silicon and the like.

Finally, a plurality of conductive through holes 470 may also be formed through etching in the semiconductor memory device as shown in FIG. 2A. The conductive through holes 470 may expose the source structure 210, the drain structure 250 or the gate structure 260, specifically, the gate layer 262 in the gate structure 260. Moreover, the conductive through holes 470 are filled with a conductive material to implement electrical connection of the source, the drain and the gate in the memory cells.

It should be noted that the method of manufacturing a semiconductor memory device according to the exemplary implementation of the present disclosure is merely schematic illustration, and the manufacturing process of each component is not limited by the present disclosure.

It should be understood that in various implementations of the present disclosure, sizes of sequence numbers of the processes described above do not imply orders of execution. The orders of execution of the processes should be determined by their functions and inherent logics, and should not be construed as limiting implementation processes of the exemplary implementations of the present disclosure.

Those skilled in the art may easily figure out other implementations of the present disclosure after considering the specification and practicing the content disclosed herein. The present disclosure is intended to cover any variations, purposes or adaptive changes of the present disclosure. Such variations, purposes or adaptive changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the claims.

The invention claimed is:

1. A semiconductor memory device, comprising:
   a substrate;
   a source structure formed on the substrate;
   a laminated structure comprising a nitride layer and an oxide layer, the nitride layer and the oxide layer being alternately laminated on the source structure;
   a floating body formed in the oxide layer, wherein a through hole is formed in the floating body along a lamination direction of the laminated structure;
   a trench region formed inside the floating body, wherein a through hole is also formed in the trench region along the lamination direction, and the trench region is in contact with the source structure;

a drain structure formed on a top of the laminated structure in the lamination direction, wherein the drain structure is in contact with the trench region; and a gate structure formed inside the trench region.

2. The semiconductor memory device according to claim 1, wherein when there are a plurality of oxide layers, the through hole of the floating body formed in different oxide layers is communicated, and runs through the nitride layers to form a communication hole.

3. The semiconductor memory device according to claim 2, wherein the trench region forms an integral structure in the communication hole and is in contact with a plurality of layers of the floating body; and one end of the trench region is in contact with one source structure and the other end of the trench region is in contact with one drain structure.

4. The semiconductor memory device according to claim 1, wherein the gate structure comprises:

a gate oxide layer formed inside the trench region, wherein a through hole is also formed in the gate oxide layer along the lamination direction; and a gate layer filled in the gate oxide layer.

5. The semiconductor memory device according to claim 4, wherein the gate structure also runs through the drain structure.

6. The semiconductor memory device according to claim 4, further comprising:

a plurality of conductive through holes configured, respectively, to expose the source structure, the drain structure or the gate layer, wherein the conductive through holes are filled with a conductive material.

7. The semiconductor memory device according to claim 3, wherein there are a plurality of source structures spaced apart from each other.

8. The semiconductor memory device according to claim 1, wherein a doping concentration of the trench region is lower than a doping concentration of the floating body.

9. The semiconductor memory device according to claim 8, wherein the floating body is doped with quantum dots.

10. A method of manufacturing a semiconductor memory device, comprising:

providing a substrate;

forming a source structure on the substrate through deposition;

alternately depositing a nitride layer and an oxide layer on the source structure in sequence, and forming a laminated structure;

performing etching to form a first through hole, the first through hole running through the laminated structure, and exposing the source structure;

partially etching the oxide layer through the first through hole, and forming an oxide layer groove;

depositing a floating body in the oxide layer groove;

depositing a trench region material layer in the first through hole, wherein the trench region material layer is in contact with the floating body;

depositing a drain structure on the laminated structure, wherein the drain structure is in contact with the trench region material layer;

performing etching to form a second through hole, the second through hole running through the drain structure and the trench region material layer, and exposing the source structure wherein a remaining trench region material layer forms a trench region; and depositing a gate structure in the second through hole.

11. The method of manufacturing a semiconductor memory device according to claim 10, wherein the depositing a floating body in the oxide layer groove comprises:

depositing a floating body material layer in the first through hole and the oxide layer groove; and etching the floating body material layer in the first through hole, and retaining the floating body material layer in the oxide layer groove and forming the floating body.

12. The method of manufacturing a semiconductor memory device according to claim 11, wherein the depositing a floating body material layer in the first through hole and the oxide layer groove comprises:

filling the first through hole and the oxide layer groove through epitaxial growth of monocrystalline silicon, and heavily doping chromium ions in the monocrystalline silicon and forming the floating body material layer.

13. The method of manufacturing a semiconductor memory device according to claim 11, wherein the etching the floating body material layer in the first through hole comprises:

etching the floating body material layer in the first through hole through self-aligned anisotropic etching.

14. The method of manufacturing a semiconductor memory device according to claim 10, wherein the depositing a gate structure in the second through hole comprises:

depositing a gate oxide layer inside the trench region through the second through hole; and filling the gate oxide layer with a gate layer.

15. The method of manufacturing a semiconductor memory device according to claim 10, wherein the forming a source structure on the substrate through deposition comprises:

depositing a first conductive structure on the substrate; and etching the first conductive structure, and doping ions in an etched first conductive structure, and forming a plurality of source structures spaced apart from each other, wherein each of the source structures corresponds to at least one first through hole.

16. The method of manufacturing a semiconductor memory device according to claim 15, wherein trenches between the plurality of source structures are filled with an insulating material to form an isolation structure.

17. The method of manufacturing a semiconductor memory device according to claim 10, wherein the depositing a drain structure on the laminated structure comprises:

depositing a second conductive structure on the laminated structure; and etching the second conductive structure, and doping ions in an etched second conductive structure, and forming a plurality of drain structures spaced apart from each other, wherein each of the drain structures corresponds to at least one first through hole.

18. The method of manufacturing a semiconductor memory device according to claim 10, further comprising:

performing etching to form conductive through holes, the conductive through holes exposing the source structure, the drain structure or the gate structure, and filling the conductive through holes with a conductive material.

* * * * *